(12) United States Patent
Oh et al.

(10) Patent No.: US 8,107,643 B2
(45) Date of Patent: Jan. 31, 2012

(54) APPARATUS AND METHOD OF AUTOMATICALLY COMPENSATING AN AUDIO VOLUME IN RESPONSE TO CHANNEL CHANGE

(75) Inventors: Yoon-hark Oh, Suwon-si (KR); Seoung-hun Kim, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 1341 days.

(21) Appl. No.: 11/116,235

(22) Filed: Apr. 28, 2005

(65) Prior Publication Data

US 2006/0018493 A1   Jan. 26, 2006

(30) Foreign Application Priority Data

Jul. 24, 2004   (KR) ........................ 10-2004-0057918

(51) Int. Cl.
*H03G 3/00* (2006.01)
*H03G 9/00* (2006.01)
*H04H 20/47* (2008.01)
*H04H 60/32* (2008.01)
*H04N 5/60* (2006.01)
*G06F 17/00* (2006.01)

(52) U.S. Cl. ............ 381/107; 381/102; 381/104; 381/2; 348/738; 725/14; 700/94

(58) Field of Classification Search .............. 381/2, 100, 381/102–109; 455/200.1, 232.1; 725/22, 725/14, 25; 348/734, 738; 704/500, 503, 704/225; 700/94

See application file for complete search history.

(56) References Cited

U.S. PATENT DOCUMENTS

| 5,771,301 | A | 6/1998 | Fuller et al. |
| 5,778,077 | A | 7/1998 | Davidson |
| 6,198,830 | B1 | 3/2001 | Holube et al. |
| 6,535,846 | B1 | 3/2003 | Shashoua |
| 6,636,609 | B1 | 10/2003 | Ha et al. |
| 7,058,188 | B1 * | 6/2006 | Allred ........................... 381/107 |
| 2005/0078840 | A1 * | 4/2005 | Riedl ............................ 381/104 |
| 2005/0175194 | A1 * | 8/2005 | Anderson ..................... 381/106 |

FOREIGN PATENT DOCUMENTS

| JP | 06-169229 | 6/1994 |
| JP | 08-298627 | 11/1996 |
| JP | 09-093064 | 4/1997 |
| JP | 10-013764 | 1/1998 |
| JP | 10-270962 | 10/1998 |
| JP | 11-088088 | 3/1999 |

(Continued)

OTHER PUBLICATIONS

Dutch Search Report dated Feb. 14, 2006 issued in NL 1029492.

(Continued)

*Primary Examiner* — Devona Faulk

(74) *Attorney, Agent, or Firm* — Stanzione & Kim, LLP

(57) ABSTRACT

An apparatus and method of automatically compensating audio volume in response to a channel change. The method includes generating a gain value to adjust a level of an input audio signal by comparing an average level of the input audio signal with a predetermined input/output level curve, adjusting an audio volume of the input audio signal by applying the generated gain value to the level of the input audio signal, and adjusting a dynamic range of the audio signal having the adjusted audio volume.

24 Claims, 14 Drawing Sheets

FOREIGN PATENT DOCUMENTS

| | | |
|---|---|---|
| JP | 11-355684 | 12/1999 |
| JP | 2000-004396 | 1/2000 |
| JP | 2000-022469 | 1/2000 |
| JP | 2000-341652 | 12/2000 |
| JP | 2001-054037 | 2/2001 |
| JP | 2001-077645 | 3/2001 |
| JP | 2001-238299 | 8/2001 |
| JP | 2001-245237 | 9/2001 |
| JP | 2001-359184 | 12/2001 |
| JP | 2002-027352 | 1/2002 |
| JP | 2002-165152 | 6/2002 |
| JP | 2003-169270 | 6/2003 |
| JP | 2004-129187 | 4/2004 |
| KR | 98-052942 | 9/1998 |
| KR | 98052942 * | 9/1998 |
| KR | 100241438 B1 | 11/1999 |

OTHER PUBLICATIONS

JP Office Action issued Aug. 2, 2011 in JP Patent Application No. 2005-206132.

* cited by examiner

X(n) – High Volume

DRC – Processed X(n)

X(n) – Intermediate Volume

DRC – Processed X(n)

X(n) – Low Volume

DRC – Processed X(n)

Static Curve 1

X(n) – High, Low,
Intermediate Volume

Global_g(h)*X(n)

y(n)=g(n)*X(n-D)

X(n) – High Volume

Global_g(h)*X(n)

$y(n)=g(n)*X(n-D)$

APPARATUS AND METHOD OF AUTOMATICALLY COMPENSATING AN AUDIO VOLUME IN RESPONSE TO CHANNEL CHANGE

CROSS-REFERENCE TO RELATED APPLICATIONS

This application claims priority from Korean Patent Application No. 2004-57918, filed on Jul. 24, 2004, in the Korean Intellectual Property Office, the disclosure of which is incorporated herein in its entirety by reference.

BACKGROUND OF THE INVENTION

1. Field of the Invention

The present general inventive concept relates to an audio signal processing system, and in particular, to an apparatus and a method of automatically compensating an audio volume in response to a channel change.

2. Description of the Related Art

Functions of TV receivers have become more diverse and complicated. To select broadcast channels in a conventional TV receiver, a user must confirm a screen status by manually changing broadcast channels. In more recent TV receivers, the user can automatically search sequential broadcast channels of receivable frequency bands.

However, when the user changes broadcast channels, audio levels of the broadcast channels are slightly different since sensitivity of reception of the broadcast channels vary from channel to channel. Therefore, an audio volume should be compensated for the change that results from the channel change.

Conventionally, a dynamic range control (DRC) method of controlling a dynamic range of an audio signal is used to compensate for the audio volume change that results from the channel change. A dynamic range may be understood as describing a ratio of volumes of a loudest sound and a softest sound of a particular broadcast channel.

FIG. 1 is a block diagram illustrating a conventional audio volume compensation apparatus that uses the DRC method.

Referring to FIG. 1, a level measuring unit 110 measures an average envelope value of an input signal X(n) in a predetermined range. For example, the average envelope value $X_{RMS}$(n) of the input signal X(n) is calculated using a|X(n)|+(1−a)·$X_{RMS}$(n−1). Here, a indicates an attack time coefficient or a decay time coefficient.

A level comparator 120 compares a level of a static level curve defining a correlation between a level of an input audio signal (i.e. the input signal X(n)) and a level of an output audio signal Y(n) according to the average envelope value $X_{RMS}$(n) measured by the level measuring unit 110. The level comparator 120 then outputs a gain level value according to a result of the comparison. The static level curve is defined by experimental values using G[dB]=f(X[dB]). Referring to FIG. 2, the average envelope value $X_{RMS}$(n) of the input audio signal X(n) is compared with levels in Sturn, Mturn, and Bturn zones of the static level curve. A gain level of an input signal X(n) having a low audio volume is mapped to an output signal Y(n) having a volume that is increased by 10 dB, and a gain level of an input signal X(n) having a high audio volume is mapped to an output signal Y(n) having a volume that is decreased by 10 dB.

A gain calculator 130 calculates a gain value g(n) to be applied to the input audio signal X(n) based on the gain level value mapped by the level comparator 120 and a previous gain value g(n−1).

A delay unit 140 delays the input audio signal X(n) until the gain value g(n) to be applied to the input audio signal X(n) is calculated.

A multiplier 150 generates the output audio signal Y(n) by multiplying the input audio signal X(n) by the gain value g(n) calculated by the gain calculator 130.

However, the conventional audio volume compensation apparatus that uses the DRC method generates the output audio signal Y(n) by reducing the dynamic range of the input audio signal X(n) in response to the audio volume change that results from a channel change. That is, as illustrated in FIGS. 3A and 3B, if the dynamic range of the input audio signal X(n) is 20 dB when the input audio signal X(n) has a high audio volume, the dynamic range is reduced to below 5 dB as a result of DRC processing. Sound effects of the input audio signal X(n) are distorted due to the reduced dynamic range. As illustrated in FIGS. 4A and 4B, if the input audio signal X(n) has an intermediate audio volume, the input audio signal X(n) is reproduced without a large change in the dynamic range as a result of DRC processing. As illustrated in FIGS. 5A and 5B, if the input audio signal X(n) has a low audio volume, due to fast attack and slow decay characteristics, the input audio signal X(n) having the low audio volume is increased to have an intermediate volume level, and the input audio signal X(n) having the intermediate volume level is reproduced without changing the dynamic range. When the audio signal X(n) having the low audio volume is input to the conventional audio volume compensation apparatus, the distortion of the output audio signal Y(n) is small, since a change of the dynamic range is small. However, there is a problem in that the audio volume of the output audio signal Y(n) is hardly changed.

SUMMARY OF THE INVENTION

The present general inventive concept provides a method of automatically compensating an audio volume for a change in the audio volume of an audio signal caused by changing a channel or for audio volume having a dynamic range that is too large.

The present general inventive concept also provides an automatic audio volume compensation apparatus to automatically compensate for an audio volume change resulting from a channel change.

Additional aspects and advantages of the present general inventive concept will be set forth in part in the description which follows and, in part, will be obvious from the description, or may be learned by practice of the general inventive concept.

The foregoing and/or other aspects and advantages of the present general inventive concept may be achieved by providing a method of automatically compensating an audio volume, the method comprising generating a gain value to adjust a level of an input audio signal by comparing an average level of the input audio signal with a predetermined input/output level curve, adjusting an audio volume of the input audio signal by applying the generated gain value to the level of the input audio signal, and adjusting a dynamic range of the audio signal having the adjusted audio volume.

The foregoing and/or other aspects and advantages of the present general inventive concept may also be achieved by providing an automatic audio volume compensation apparatus comprising a first audio volume compensator to generate a first gain value to adjust a level of a first input audio signal by comparing an average level of the first input audio signal with a predetermined input/output level curve, a first multiplier to multiply the level of the first input audio signal by the first gain value generated by the first audio volume compensator to output a second input audio signal, a second audio volume compensator to generate a second gain value to adjust a dynamic range of the second input audio signal output from the first multiplier, and a second multiplier to multiply the second input audio signal output from the first multiplier by the second gain value generated by the second audio volume compensator.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
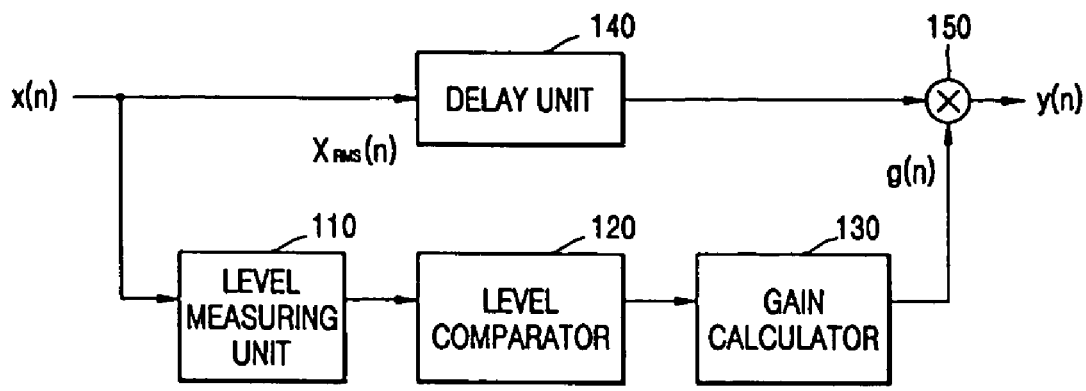
FIG. 1 is a block diagram illustrating a conventional audio volume compensation apparatus that uses a dynamic range control (DRC) method.
Figure 2:
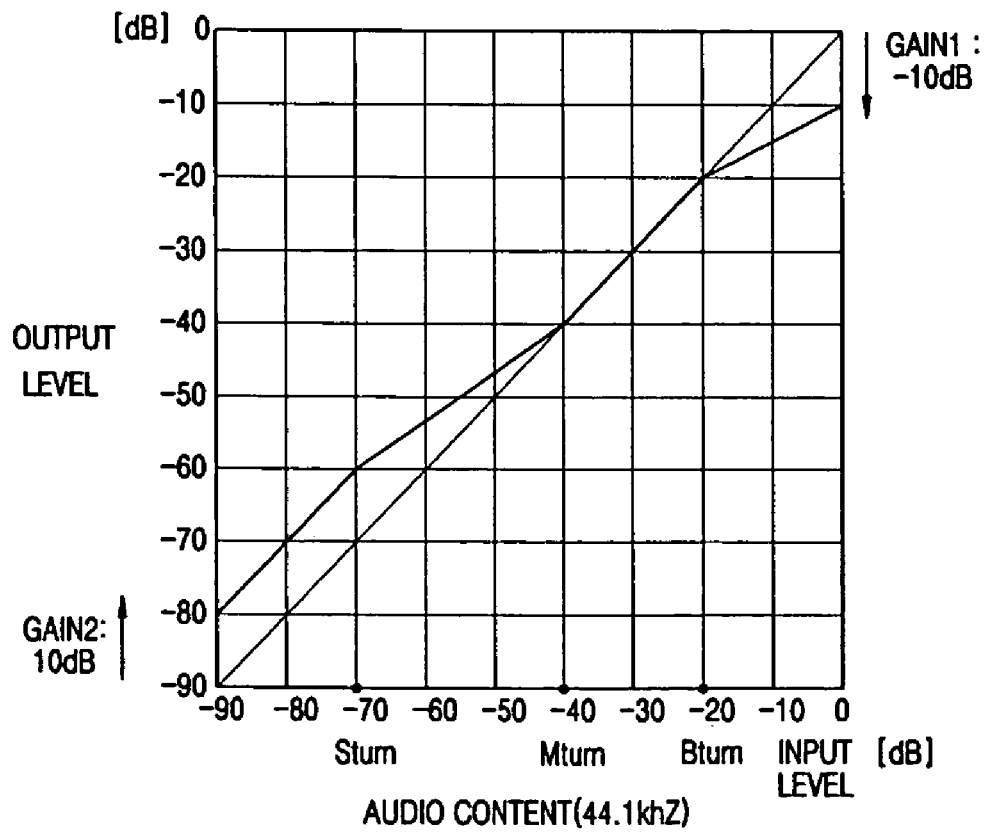
FIG. 2 is a graph illustrating a static level curve used by a level comparator of the conventional audio volume compensation apparatus of FIG. 1.
Figure 3A:
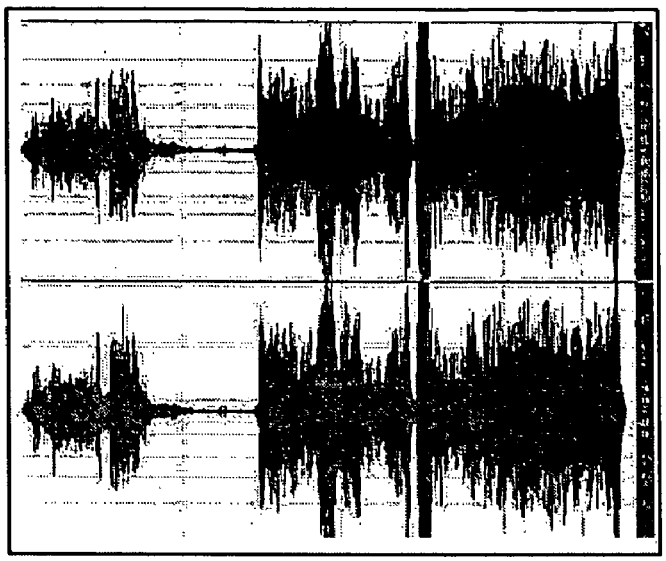
FIGS. 3A through 5B are waveform diagrams illustrating DRC output results according to changes in audio volume.
Figure 3B:
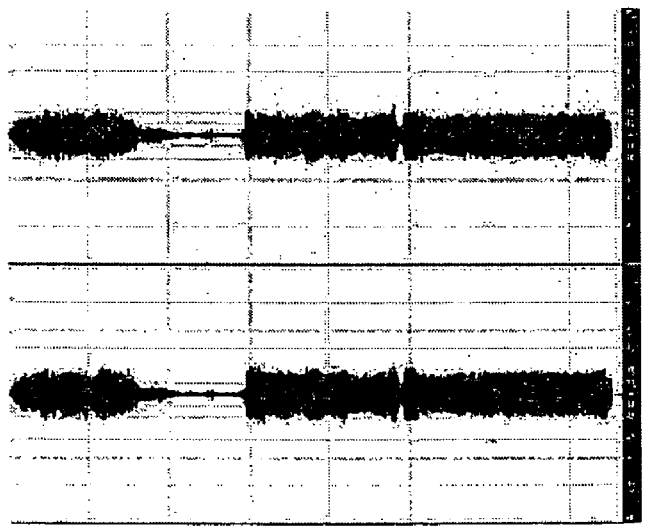
Figure 4A:
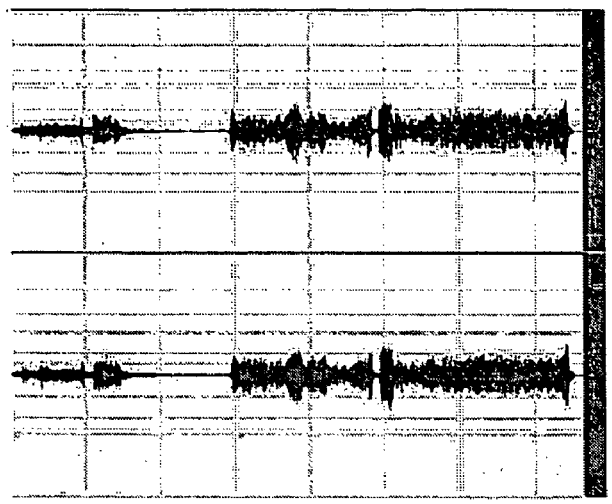
Figure 4B:
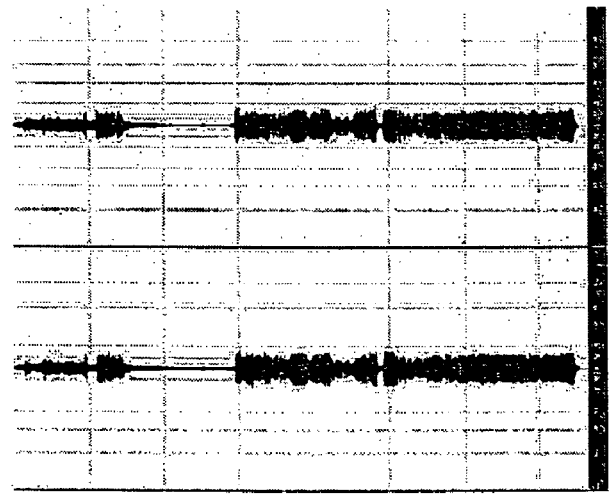
Figure 5A:
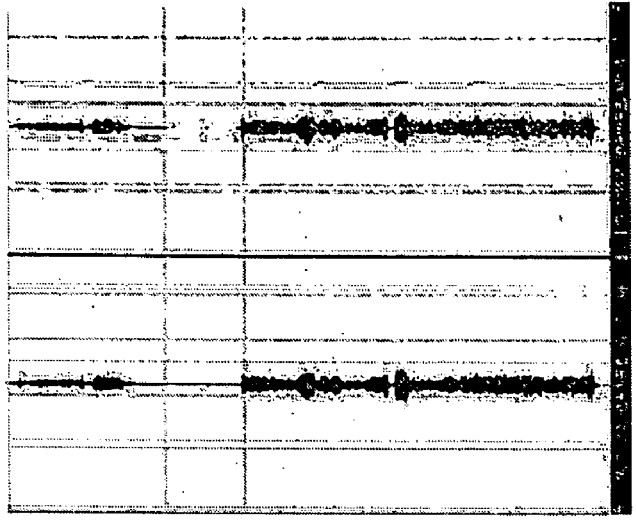
Figure 5B:
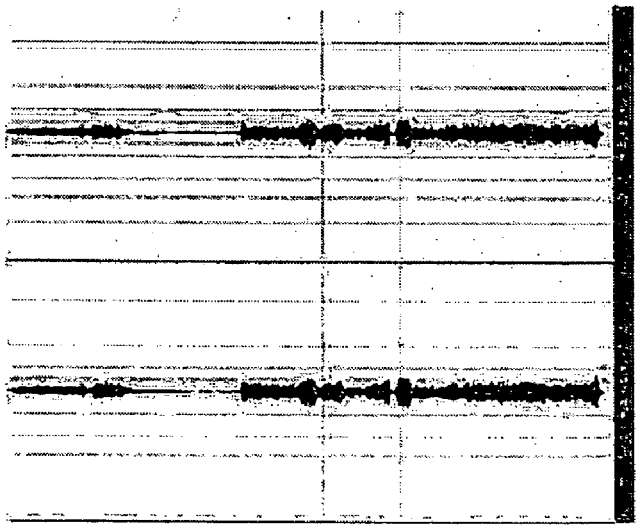

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Figure 6:
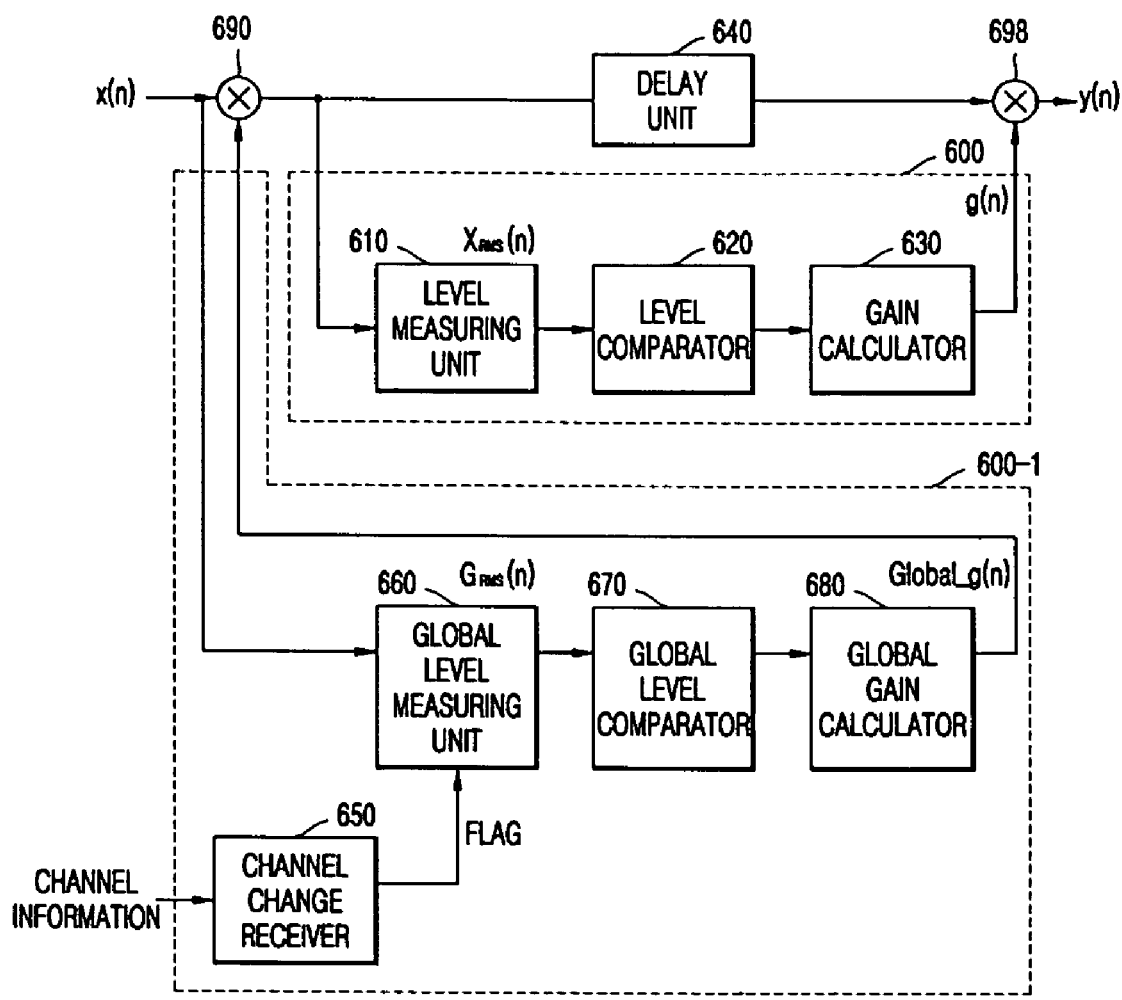
FIG. 6 is a block diagram illustrating an apparatus to automatically compensate an audio volume in response to a channel change according to an embodiment of the present general inventive concept.

FIG. 6 is a block diagram illustrating an apparatus to automatically compensate an audio volume in response to a channel change according to an embodiment of the present general inventive concept.

Referring to FIG. 6, the apparatus includes a first audio volume compensator 600-1 to adjust a level of an input audio signal X(n), a second audio volume compensator 600 to adjust a dynamic range of the input audio signal X(n), a first multiplier 690 to multiply the input audio signal X(n) by a first gain value adjusted by the first audio volume compensator 600-1, a delay unit 640 to delay the input audio signal X(n) output from the first multiplier 690 for a predetermined time, and a second multiplier 698 to generate an output audio signal Y(n) by multiplying the input audio signal X(n) delayed by the delay unit 640 by a second gain value adjusted by the second audio volume compensator 600.

Referring to FIG. 6, a channel change receiver 650 sets a flag when channel change data is received according to channel information. For example, the flag is set to "1" when a TV broadcast channel is changed from "channel 11" to "channel 9."

With reference to the first audio volume compensator 600-1, a global level measuring unit 660 generates a global root mean square (RMS) value $G_{RMS}$ indicating a global audio volume of an input signal (i.e., the input audio signal X(n)) by consecutively calculating average levels of the input signal X(n) in a predetermined range. For example, the global RMS value $G_{RMS}$ of an updated input signal is given by $G_{RMS}(n)=k|X(n)|+(1-k)\cdot G_{RMS}(n-1)$. Here, |X(n)| is an absolute value of the updated input signal, $G_{RMS}(n-1)$ is an RMS value of a previous signal, and k is an attack time coefficient or a decay time coefficient. For example, k can be set to 0.0001-0.0005. The global level measuring unit 660 initializes the global RMS value $G_{RMS}$ to an intermediate audio volume range when the flag is received from the channel change receiver 650.

Figure 7:
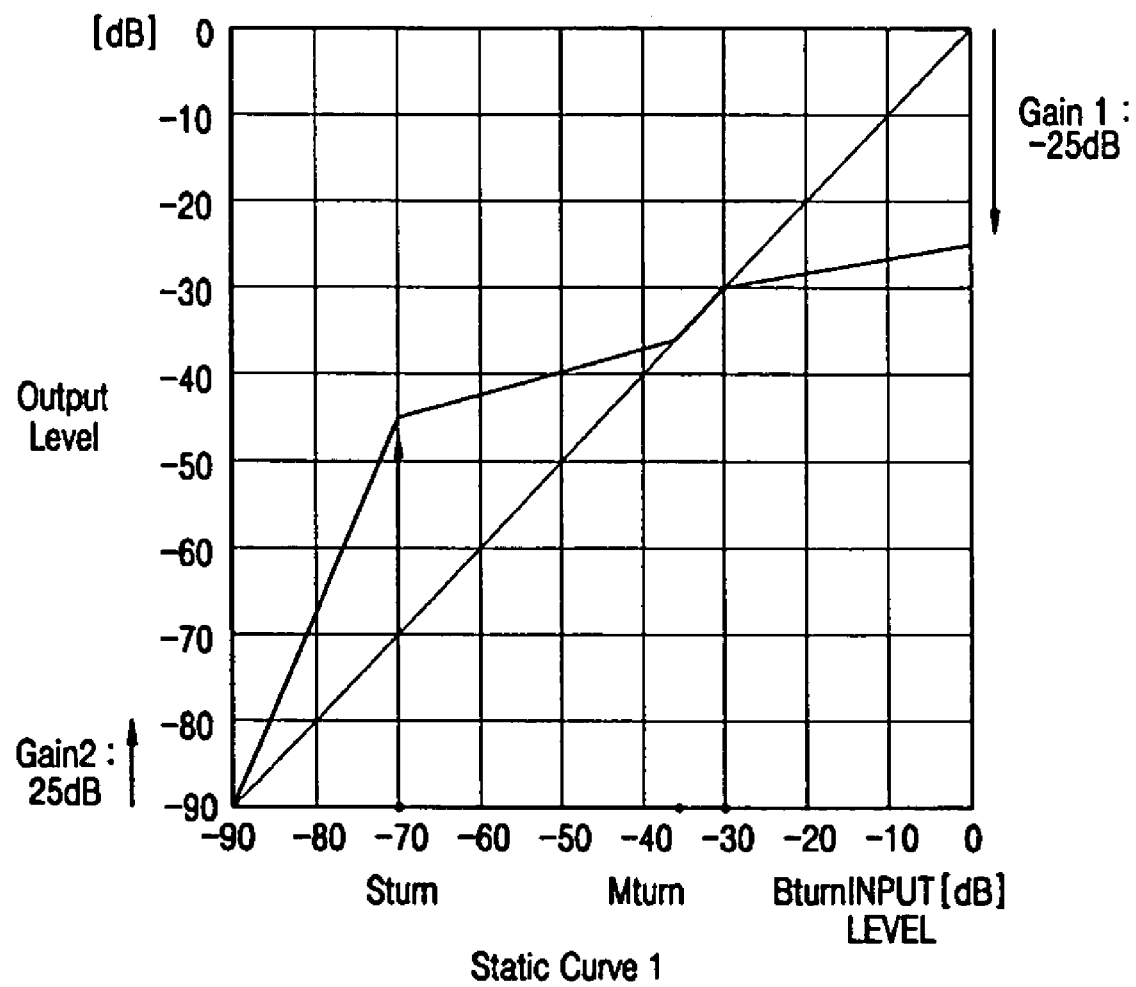
FIG. 7 is a graph illustrating a static level curve used by a global level comparator of the compensation apparatus of FIG. 6.

A global level comparator 670 compares a level of a static level curve defining a correlation between an input level and an output level with the global RMS value $G_{RMS}$ measured by the global level measuring unit 660 and generates a gain level value G(n) according to the comparison result. Here, the static level curve is defined by G[dB]=f (X[dB]). The static level curve may be determined experimentally. Referring to FIG. 7, a mapped gain level value G(n) is generated by comparing the global RMS value $G_{RMS}$ of the input audio signal X(n) with values of the static level curve in static level curve zones Sturn, Mturn, and Bturn. Accordingly, the global level comparator 670 maps the input signal X(n) having a high audio volume to a signal having an intermediate audio volume, and also maps the input signal X(n) having a low audio volume to a signal having the intermediate audio volume. For example, a gain of the input signal X(n) having the low audio volume is mapped to a first intermediate gain level value by increasing the gain by 25 dB (Gain 2 in FIG. 7), and a gain of the input signal X(n) having the high audio volume is mapped to a second intermediate gain level value by decreasing the gain by 25 dB (Gain 1 in FIG. 7). The static level curve can be a predetermined input/output level curve, and the global GMS value $G_{RMS}$ can be a calculated average level of previous input signals.

A global gain calculator 680 calculates a global gain value Global_g(n) to be applied to the input audio signal X(n) using the gain level value G(n) generated by the global level comparator 670 and a previous global gain value Global_g(n-1). That is, the global gain value Global_g(n) is defined by Global_g(n)=Global_g(n-1)·0.5+G(n) 0.5.

The first multiplier 690 adjusts a gain of the input audio signal X(n) by multiplying the input audio signal X(n) by the global gain value Global_g(n) calculated by the global gain calculator 680. The input audio signal X(n) having the adjusted gain is output from the first multiplier 690 as a second input signal used as the input audio signal X(n) which will be processed in the second audio volume compensator 600.

With reference to the second audio volume compensator 600, a level measuring unit 610 measures an average envelope value $X_{RMS}(n)$ of the input audio signal X(n), having the gain level adjusted by the first multiplier 690, in a predetermined range. For example, the average envelope value $X_{RMS}(n)$ of the input audio signal X(n) is defined by $X_{RMS}(n)=a|X(n)|+(1-a)\cdot X_{RMS}(n-1)$. Here, a is an attack time coefficient or a decay time coefficient. The input audio signal X(n) is in an attack state when $|X(n)|>X_{RMS}(n-1)$, and the input audio signal X(n) is in a decay state when $|X(n)|<X_{RMS}(n-1)$.

A level comparator 620 compares the static level curve zones Sturn, Mturn, and Bturn, in which a correlation between an input level and an output level is defined, with the average envelope value $X_{RMS}(n)$ measured by the level measuring unit 610 and calculates a gain level value according to the comparison result. That is, the calculated gain level value of an input signal X(n) having a low audio volume is positive, and the calculated gain level value of an input signal X(n) having the high audio volume is negative.

A gain calculator 630 generates a final gain value g(n) to be applied to the input audio signal X(n) using the gain level value calculated by the level comparator 620 and a previous gain value g(n−1).

The delay unit 640 delays the input audio signal X(n) until the final gain value g(n) is applied to the input audio signal X(n).

The second multiplier 698 generates an output audio signal y(n) having an adjusted dynamic range by multiplying the input audio signal X(n) delayed by the delay unit 640 by the final gain value g(n) generated by the gain calculator 630. The output audio signal Y(n) is defined by y(n)=g(n) X(n−D). Here, X(n−D) indicates the input audio signal X(n) delayed by the delay unit 640.

That is, an average level of the input signal X(n) in a predetermined range is calculated, the input signal X(n) is adjusted to have an intermediate audio volume, and a dynamic range of the adjusted input signal X(n) is adjusted using a conventional DRC processing method. Therefore, the input signal X(n) having the intermediate audio volume generated by an embodiment of the present general inventive concept provides a more appropriate audio volume for the conventional DRC processing method. As a result, an output signal Y(n) has less distortion than an output signal obtained when a conventional DRC processing is performed on an input signal X(n) having a high audio volume or a low audio volume.

Figure 8A:
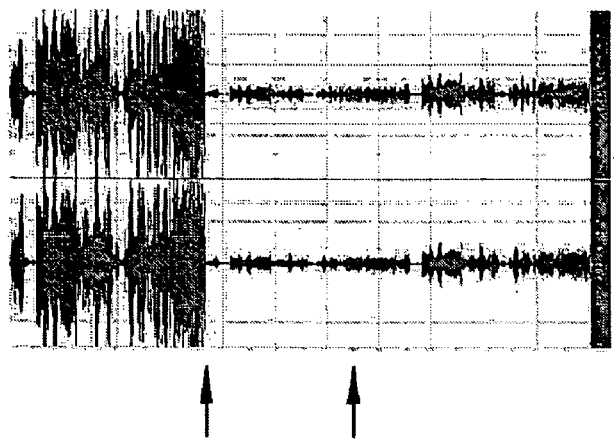
FIGS. 8A through 8C are waveform diagrams illustrating cases in which an audio volume is changed from a high volume to a low volume and from the low volume to an intermediate volume according to a channel change.
Figure 8B:
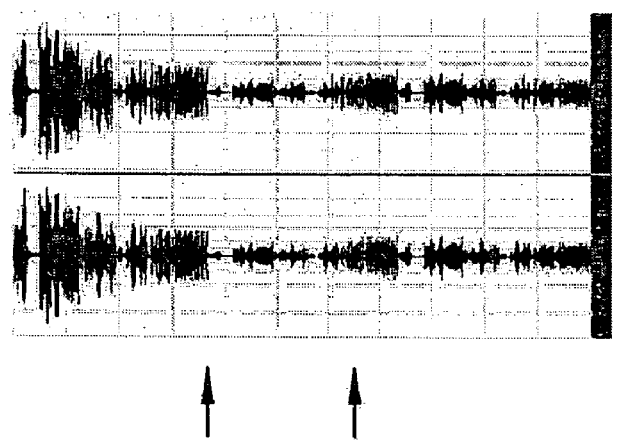
Figure 8C:
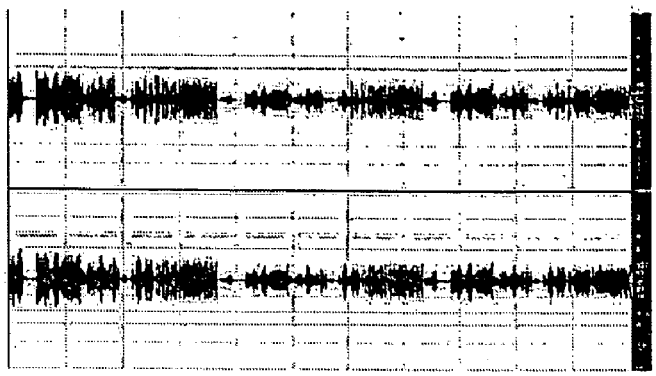

FIGS. 8A through 8C are waveform diagrams illustrating cases in which an audio volume is changed from a high audio volume to a low audio volume and from the low audio volume to an intermediate audio volume according to a channel change of an embodiment the present general inventive concept.

FIG. 8A is a waveform diagram illustrating an input audio signal X(n) when an audio volume of the input audio signal X(n) is changed from the high audio volume to the low audio volume and from the low audio volume to the intermediate audio volume according to the channel change. Arrow marks indicate points at which a channel change flag is set by a channel change receiver 650 (see FIG. 6).

FIG. 8B is a waveform diagram illustrating an audio signal obtained by applying the global gain Global_g(n) calculated by the global gain calculator 680 (see FIG. 6) to the input audio signal X(n). Here, when the channel change flag is set, the RMS level $G_{RMS}$ is set to an initial value of the intermediate audio volume.

FIG. 8C is a waveform diagram illustrating the output audio signal y(n) having the dynamic range adjusted by applying the final gain value g(n) generated by the gain calculator 630 (see FIG. 6) to the delayed input audio signal X(n−D). Referring to FIG. 8C, the distortion of the output audio signal y(n) is minimized by automatically adjusting the audio volume.

FIGS. 9A through 9F are waveform diagrams and graphs illustrating results of audio volume compensation of an audio signal having a high audio volume according to an embodiment of the present general inventive concept.

Figure 9A:
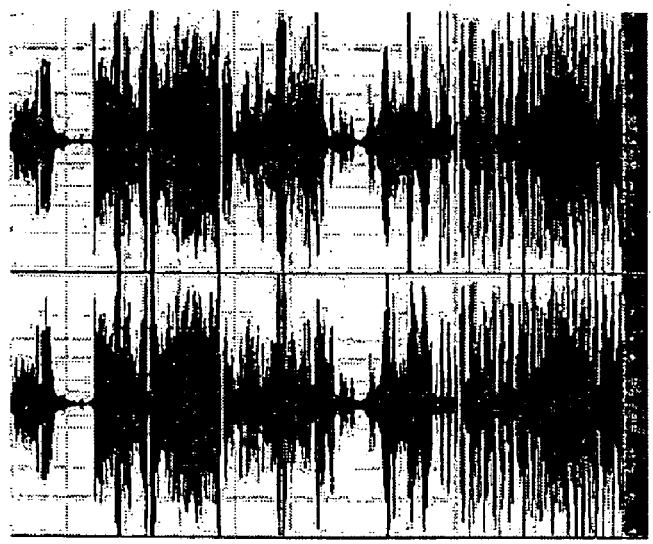
FIGS. 9A through 9F are waveform diagrams and graphs illustrating results of audio volume compensation of an audio signal with a high audio volume.

FIG. 9A is a waveform diagram illustrating the input audio signal X(n) having the high audio volume.

Figure 9B:
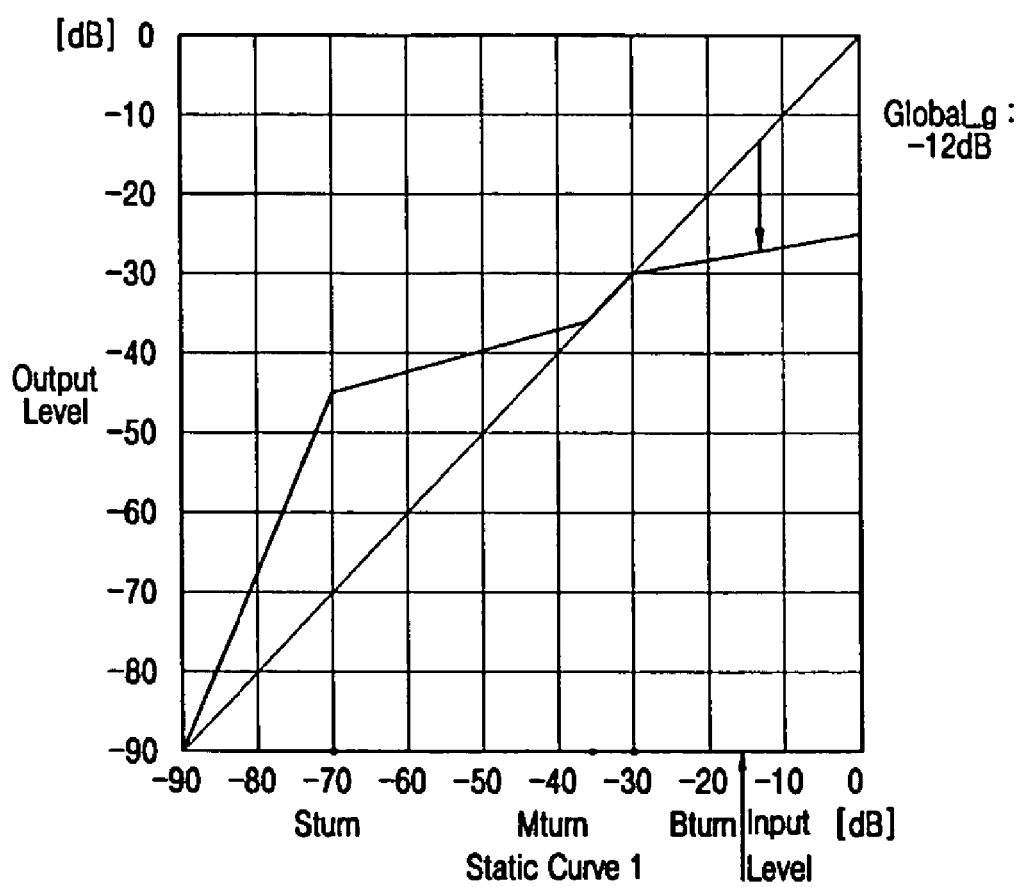

FIG. 9B is a graph illustrating a static level curve and the global RMS value $G_{RMS}$ used to calculate the global gain value Global_g(n). Referring to FIG. 9B, in a high audio volume level zone (Bturn) of an input signal X(n) is mapped to an intermediate signal level of a static curve level. For example, an input signal level of −14 dB is mapped to an intermediate signal level of −26 dB, which is −12 dB higher than the input signal level X(n). Accordingly, the global gain value Global_g(n) is set to −12 dB.

Figure 9C:
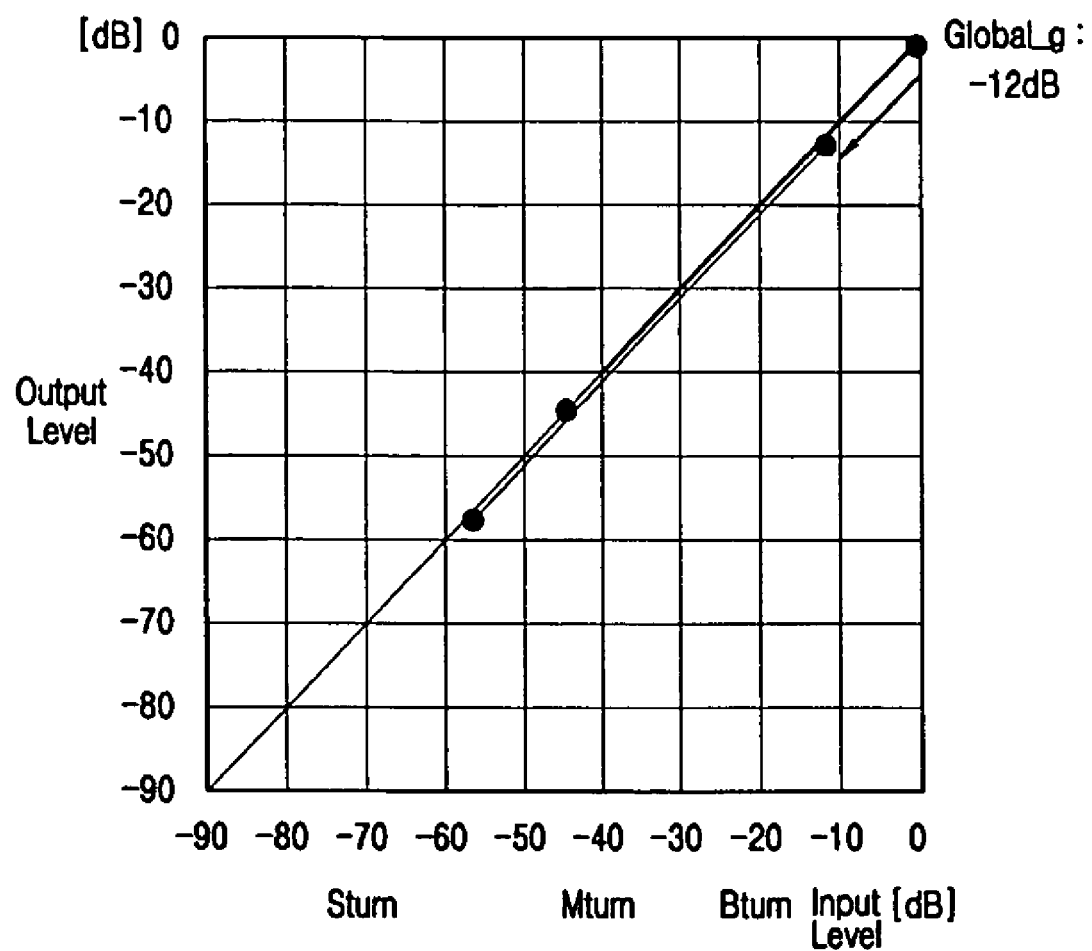

FIG. 9C is a graph illustrating that, with respect to FIG. 9B, a static level curve and a dynamic range of the input signal X(n) are moved as indicated by an arrow as a result of applying the global gain value Global_g(n) (−12 dB) to the input signal X(n). Accordingly, a signal having an adjusted gain level is obtained.

Figure 9D:
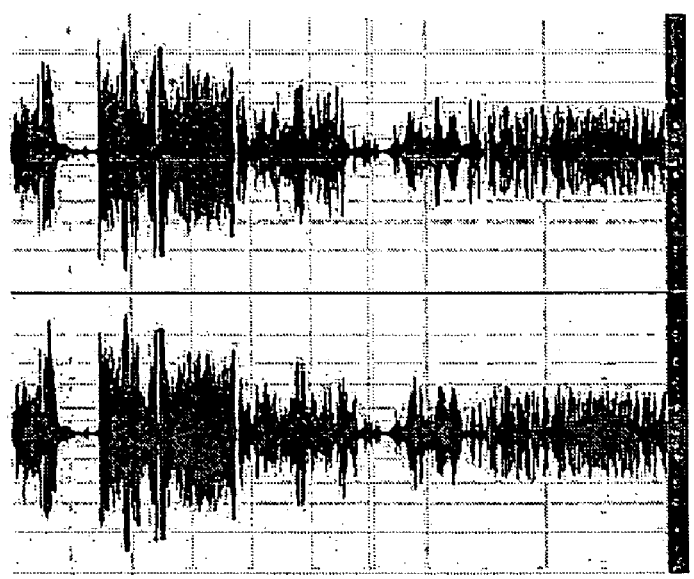

FIG. 9D is a waveform diagram illustrating a signal having an adjusted gain level obtained as a result of applying the global gain value Global_g(n) (−12 dB) to the input signal X(n) having the high audio volume.

Figure 9E:
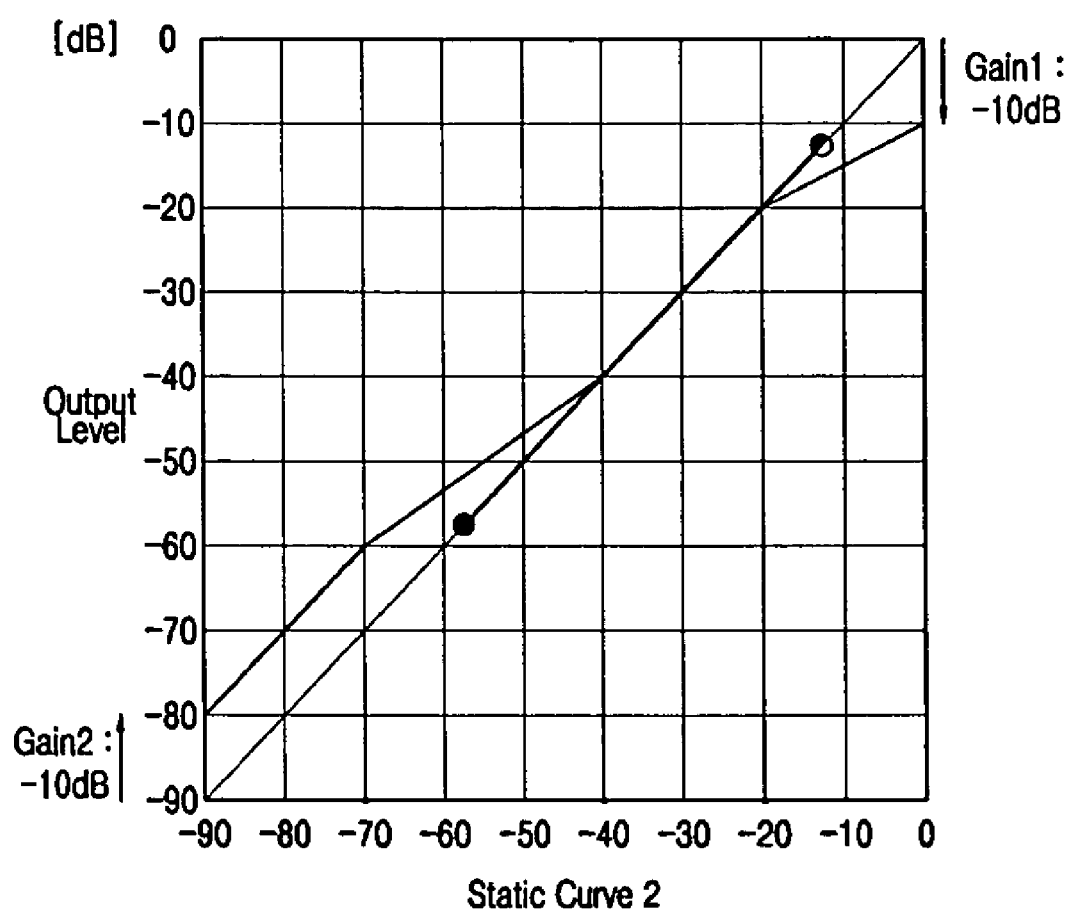

FIG. 9E is a graph illustrating a calculation of a final gain value g(n) from a static level curve using an RMS level of the signal having the adjusted gain level. That is, a predetermined static level on the static level curve is compared with the average envelope value $X_{RMS}(n)$ measured by the level measuring unit 610 (see FIG. 6), and the final gain value g(n) based on the comparison result is output. A final gain value g(n) of an input signal X(n) having a low audio volume is positive (10 dB), and a final gain value g(n) of an input signal X(n) having a high audio volume is negative (−10 dB).

Figure 9F:
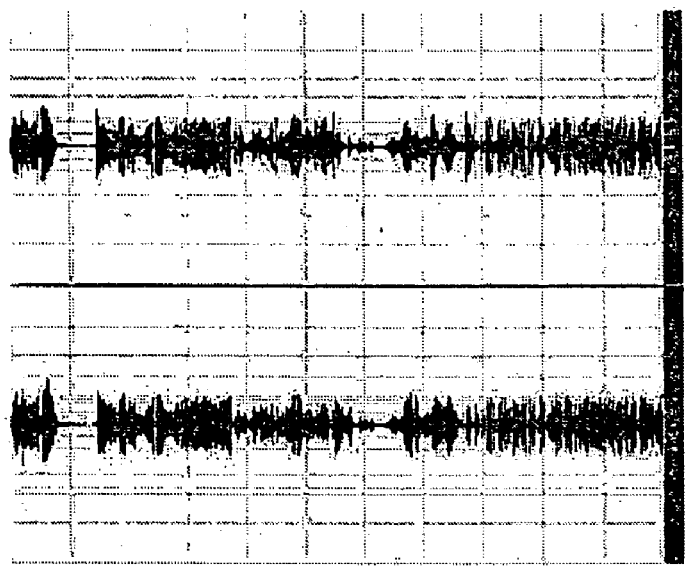

FIG. 9F is a waveform diagram illustrating the output signal y(n) having a dynamic range that is obtained by applying the final gain value g(n) generated by the gain calculator 630 (see FIG. 6) to the delayed input audio signal X(n−D). Referring to FIG. 9F, a signal having minimal distortion and an appropriate audio volume is output by applying the final gain value to the signal having the adjusted gain level obtained by applying the global gain value Global_g(n) (−12 dB) to the input signal X(n).

Figure 10:
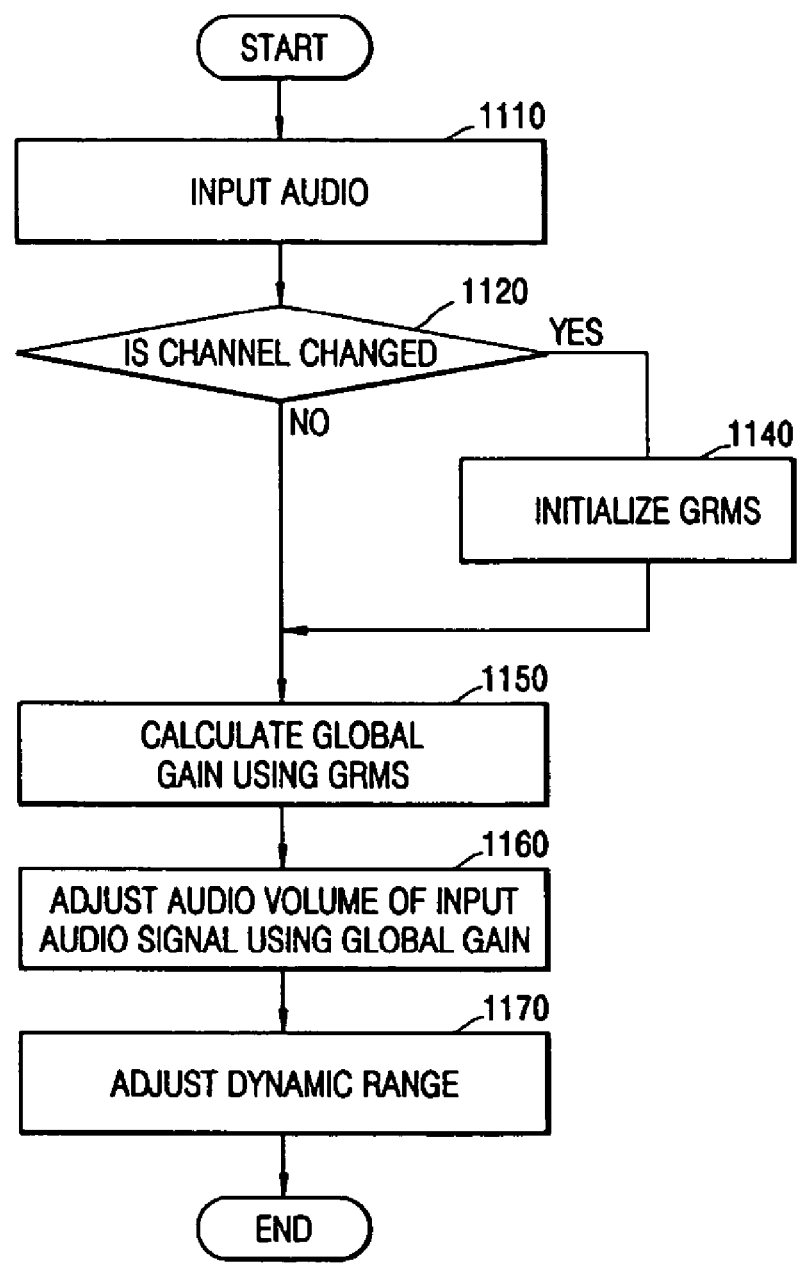
FIG. 10 is a flowchart illustrating a method of automatically compensating an audio volume according to an embodiment of the present general inventive concept.

FIG. 10 is a flowchart illustrating a method of automatically compensating an audio volume according to an embodiment of the present general inventive concept.

Referring to FIG. 10, an audio signal X(n) broadcast on a channel is input to a broadcast receiver in operation 1110. If the channel is changed in operation 1120, a global RMS value $G_{RMS}$ is initialized as an RMS level of an intermediate audio volume in operation 1140. Otherwise, the global RMS value $G_{RMS}$ is not initialized. A global gain value Global_g(n) is then calculated by comparing a predetermined input/output level curve with an average level of the input audio signal X(n) in operation 1150. A gain level of the input audio signal X(n) is adjusted by multiplying the input audio signal X(n) in operation 1160 by the global gain value Global_g(n) calculated in the operation 1150. A dynamic range of the input audio signal X(n) to which the global gain value Global_g(n) is applied is then adjusted using the conventional DRC processing method in operation 1170.

The present general inventive concept can be applied to any device used to reproduce audio content, such as TVs, MP3 players, and laptop computers.

As described above, according to the embodiments of the present general inventive concept, an audio volume of an output signal corresponding to an input signal can be maintained constant without requiring a user to adjust the audio volume of the output signal when the channel is changed. The audio volume can be automatically adjusted to an appropriate audio volume when the channel is changed to a channel having a different volume or a channel having a dynamic range that is too large. Therefore, product performance can be improved by effectively applying the present general inventive concept to TVs, MP3 players, laptop computers, or any other audio content reproducing apparatus. Therefore, product performance can be improved by effectively applying the present general inventive concept to TVs, MP3 players, laptop computers, or any other audio content reproducing apparatus.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of automatically compensating audio volume, the method comprising:
    generating a gain value to adjust a level of a current input audio signal by comparing a global value, which is based on consecutive average levels of the current input audio signal and at least one previous input audio signal in a predetermined range, with a predetermined input/output level curve;
    adjusting an audio volume of the input audio signal by applying the generated gain value to the level of the input audio signal; and
    adjusting a dynamic range of the input audio signal having the adjusted audio volume.

2. The method of claim 1, further comprising:
    initializing the level of the current input audio signal to a predetermined level when a broadcast channel is changed.

3. The method of claim 2, wherein the initializing of the level of the input audio signal comprises initializing the level of the input audio signal to an intermediate level between a maximum level and a minimum level.

4. The method of claim 1, wherein the generating of the gain value comprises:
    calculating the global value by calculating the level of the input audio signal in a predetermined range; and
    generating the gain value by comparing the global value of the input audio signal with the input/output level curve based on a predetermined input/output equation and mapping the global value of the input audio signal in the predetermined range to a predetermined level of the input/output level curve.

5. The method of claim 4, wherein the generating of the gain value comprises adjusting the global value of the input audio signal to a first level of an intermediate audio volume when the input audio signal has a high audio volume, and adjusting the global value of the input audio signal to a second level of the intermediate audio volume when the input audio signal has a low audio volume.

6. The method of claim 1, wherein the adjusting of the audio volume of the input audio signal comprises adjusting the input audio signal to an intermediate level between a maximum level and a minimum level.

7. The method of claim 1, wherein the adjusting of the dynamic range of the audio signal comprises:
    calculating an average envelope value of the input audio signal in a predetermined range;
    comparing the calculated average envelope value of the input audio signal with a level curve based on a predetermined input/output equation and mapping the calculated average envelope value of the input audio signal to a level defined by the input/output level curve; and
    adjusting the dynamic range of the input audio signal by multiplying the input audio signal by the mapped level.

8. A method of controlling an audio volume, comprising:
    adjusting a volume level and a dynamic range of an input audio signal according to a global gain value and a final gain value of the input audio signal so that an audio volume of an output audio signal corresponding to the input audio signal is maintained constant regardless of a channel change,
    wherein the adjusting of the dynamic range of the audio signal includes measuring an average envelope value of the input audio signal in a predetermined range, comparing the average envelope value with a static level curve to generate a gain level value, and calculating the final gain value according to the gain level value and a previous gain level value of the input audio signal.

9. The method of claim 8, wherein the adjusting of the volume level and the dynamic range of the input audio signal comprises:
    adjusting the volume level of the input audio signal; and
    adjusting the dynamic range of the input audio signal having the adjusted volume level.

10. The method of claim 8, wherein the adjusting of the volume level and the dynamic range of the input audio signal comprises:
    adjusting the volume level according to the global gain value and static level curve zones; and
    adjusting the dynamic range according to the final gain value and the static level curve zones.

11. The method of claim 8, wherein the adjusting of the volume level comprises:
    measuring average levels of the input audio signals in a predetermined range to generate a global RMS value;
    comparing the global RMS value with a level of a static level curve to generate a gain level value; and
    calculating the global gain value according to the gain level value and a previous gain level value of the input audio signal.

12. The method of claim 8, wherein the adjusting of the volume level and the dynamic range comprises:
    adjusting the volume level to an intermediate volume when a channel is changed having one of a high volume and a low volume; and
    adjusting the dynamic range according to a dynamic range control process.

13. The method of claim 12, wherein the adjusting of the volume level of the input audio signal comprises:
    initializing a global root mean square (RMS) of the input audio signal when a current channel is changed;
    calculating a global gain according to $$\text{Global\_g}(n) = \text{Global\_g}(n-1) \cdot 0.5 + G(n) \cdot 0.5$$

where Global_g(n) is the global gain value, Global_g(n−1) is a previous global gain value, and G(n) is a first gain level mapped from a value of the input audio signal to a first predetermined gain level curve; and
    adjusting the volume level of the input audio signal according to the global gain value.

14. The method of claim 13, wherein the first predetermined gain level curve decreases a high volume level by a first predetermined decibel level and increases a low volume level by a second predetermined decibel level.

15. The method of claim 14, wherein the high volume level corresponds to a Bturn zone of the first predetermined gain level curve and the low volume level corresponds to an Sturn zone of the first predetermined gain level curve.

16. The method of claim 12, wherein the adjusting of the dynamic range of the input audio signal comprises:
determining an average envelope value of the volume adjusted input audio signal;
comparing the average envelope value with a second predetermined gain level curve to determine a second gain level; and
calculating the final gain value according to the second gain level and a previous final gain value; and
adjusting the dynamic range of the input audio signal by applying the final gain value to the volume adjusted input audio signal.

17. The method of claim 16, wherein the average envelope information is determined according to:

$$X_{RMS}(n)=a|X(n)|+(1-a)\cdot X_{RMS}(n-1),$$

where $X_{RMS}(n)$ is a root mean square value of the input audio signal, $\alpha$ is one of a decay time coefficient and an attack time coefficient, $|X(n)|$ is an absolute value of the input audio signal, and $X_{RMS}(n-1)$ is a previous root mean square value of the input audio signal.

18. The method of claim 16, wherein the final gain value is positive when the input audio signal has a low volume and the final gain value is negative when the input audio signal has a high volume.

19. The method of claim 12, further comprising:
changing a channel of the input audio signal to a channel having a different corresponding volume level.

20. An apparatus to control an audio volume, comprising:
an audio volume compensator to adjust a volume level and a dynamic range of an input audio signal according to a global gain value and a final gain value of the input audio signal so that an audio volume of an output audio signal corresponding to the input audio signal is maintained constant regardless of a channel change,
wherein the audio volume compensator adjusts the volume level and the dynamic range of the input audio signal by adjusting the volume level to an intermediate volume when a channel is changed having one of a high volume and a low volume, and adjusting the dynamic range according to a dynamic range control process.

21. The apparatus of claim 20, wherein the audio volume compensator adjusts the volume level and the dynamic range of the input audio signal by adjusting the volume level of the input audio signal, and adjusting the dynamic range of the input audio signal having the adjusted volume level.

22. The apparatus of claim 20, wherein the audio volume compensator adjusts the volume level and the dynamic range of the input audio signal by adjusting the volume level according to the global gain value and static level curve zones, and adjusting the dynamic range according to the final gain value and the static level curve zones.

23. The apparatus of claim 20, wherein the audio volume compensator adjusts the volume level of the input audio signal by measuring average levels of the input audio signals in a predetermined range to generate a global RMS value, comparing the global RMS value with a level of a static level curve to generate a gain level value, and calculating the global gain value according to the gain level value and a previous gain level value of the input audio signal.

24. The apparatus of claim 20, wherein the audio volume compensator adjusts the dynamic range of the input audio signal by measuring an average envelope value of the input audio signal in a predetermined range, comparing the average envelope value with a static level curve to generate a gain level value, and calculating the final gain value according to the gain level value and a previous gain level value of the input audio signal.

* * * * *